United States Patent
Otaka et al.

(10) Patent No.: US 9,281,830 B2
(45) Date of Patent: Mar. 8, 2016

(54) RADIO APPARATUS

(75) Inventors: Shoji Otaka, Kanagawa-ken (JP);
Takafumi Yamaji, Kanagawa-ken (JP);
Tsutomu Sugawara, Tokyo (JP);
Yasuhiko Tanabe, Tokyo (JP);
Masahiro Hosoya, Tokyo (JP); Hiroki Sakurai, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 413 days.

(21) Appl. No.: 13/421,391

(22) Filed: Mar. 15, 2012

(65) Prior Publication Data

US 2012/0214434 A1 Aug. 23, 2012

Related U.S. Application Data

(63) Continuation of application No. PCT/JP2009/007129, filed on Dec. 22, 2009.

(51) Int. Cl.
*H04B 7/12* (2006.01)
*H03L 7/18* (2006.01)
(Continued)

(52) U.S. Cl.
CPC ............... *H03L 7/18* (2013.01); *H03L 7/0802* (2013.01); *H04L 27/38* (2013.01); *H04L 27/3818* (2013.01); *H04W 52/0229* (2013.01); *H04W 52/0274* (2013.01); *Y02B 60/50* (2013.01)

(58) Field of Classification Search
CPC ... H04L 27/2647; H04L 7/042; H04L 1/0045; H04L 27/2649; H04L 1/0025; H04L 7/0079; H04L 1/06; H04W 52/0229; H04W 56/0035; H04W 84/12; H04W 24/00; H04W 48/14; H04W 52/0245; H04W 52/287; H04W 74/006; H04W 52/52; H04B 1/1615; H04B 7/0811; H04B 7/0808; H04B 1/18; H04B 7/0871; H04B 1/406; H04B 7/0817; H04B 7/082; H04B 1/7107; H04B 7/0848; H04B 7/0802; H04B 7/0857; H04J 13/0003; H03J 7/02; H03J 9/002; H03G 3/3052; H03G 3/3068
USPC ............... 455/130–355, 76–87, 226.1–226.4, 455/67.11–67.16; 375/322
See application file for complete search history.

(56) References Cited

U.S. PATENT DOCUMENTS 4,596,046 A 6/1986 Richardson et al.
5,018,015 A 5/1991 Sunada et al.
(Continued)

FOREIGN PATENT DOCUMENTS

JP 2003-046353 A 2/2003
JP 2003-087180 A 3/2003
(Continued)

OTHER PUBLICATIONS

U.S. Appl. No. 13/422,636, filed Mar. 16, 2012: First Named Inventor: Shoji Otaka: Title: "Radio Apparatus".
(Continued)

*Primary Examiner* — Lana N Le
(74) *Attorney, Agent, or Firm* — Holtz, Holtz & Volek PC (57) ABSTRACT

A radio apparatus includes a first receiver that is a processing unit for amplifying and frequency converting a radio signal received via an antenna, thereby outputting an IF signal; a detector unit for detecting a preamble signal from the IF signal; a second receiver for amplifying and quadrature demodulating the radio signal, thereby generating an I-signal and a Q-signal; a demodulator unit for demodulating the I-signal and Q-signal to generate a data signal; and a control unit for halting the operation of the first receiver and further activating the second receiver when the detector unit detects the preamble signal and for activating the first receiver and halting the operation of the second receiver when the demodulator unit completes the demodulation of the I-signal and Q-signal.

6 Claims, 10 Drawing Sheets

(51) Int. Cl.
*H03L 7/08* (2006.01)
*H04L 27/38* (2006.01)
*H04W 52/02* (2009.01)

(56) References Cited

U.S. PATENT DOCUMENTS

| | | | |
|---|---|---|---|
| 6,233,061 B1 | 5/2001 | Huang et al. | |
| 6,549,078 B1 | 4/2003 | Sridharan et al. | |
| 7,460,842 B2 | 12/2008 | Black et al. | |
| 7,606,329 B2 | 10/2009 | Yamauchi | |
| 8,204,537 B2* | 6/2012 | Behzad et al. | 455/552.1 |
| 2003/0027538 A1 | 2/2003 | Masumoto et al. | |
| 2005/0227638 A1* | 10/2005 | Suematsu et al. | 455/118 |
| 2006/0223466 A1* | 10/2006 | Behzad | 455/136 |
| 2008/0024208 A1 | 1/2008 | Oishi et al. | |
| 2009/0052417 A1 | 2/2009 | Sakamoto et al. | |
| 2009/0067356 A1 | 3/2009 | Sakamoto et al. | |
| 2009/0310524 A1* | 12/2009 | Katsube et al. | 375/322 |
| 2010/0045443 A1* | 2/2010 | Steeves | 340/10.5 |
| 2010/0056054 A1 | 3/2010 | Yamato et al. | |
| 2010/0164629 A1 | 7/2010 | Behzad et al. | |
| 2012/0208483 A1 | 8/2012 | Otaka et al. | |

FOREIGN PATENT DOCUMENTS

| | | |
|---|---|---|
| JP | 2004-320377 A | 11/2004 |
| JP | 2005-229570 A | 8/2005 |
| JP | 2008-061232 A | 3/2008 |
| JP | 2008-288879 A | 11/2008 |

OTHER PUBLICATIONS

International Preliminary Report on Patentability (IPRP) and Written Opinion dated Jul. 5, 2012 (in English) issued in counterpart International Application No. PCT/JP2009/007129.
M. Krstic et al; Optimized Low-Power Synchronizer Design for the IEEE 802.11a Standard; 2003 IEEE; pp. 11-333 to 11-336.
International Search Report dated Apr. 6, 2010 (in English) in counterpart International Application No. PCT/JP2009/007129.

* cited by examiner

RADIO APPARATUS

CROSS REFERENCE TO RELATED APPLICATIONS

This application is a continuation of International Application No. PCT/JP2009/007129 filed on Dec. 22, 2009, the entire contents of which are incorporated herein by reference.

FIELD

Embodiments relate to a radio apparatus.

BACKGROUND

A radio apparatus that performs communications using a random access method, such as a wireless LAN, is required to keep awaiting a signal, since it is not known when the signal is transmitted. In general, a period of time for awaiting a signal is longer than period of time for receiving a signal. In order to reduce power consumption of the whole radio apparatus, it is important to reduce power consumption during standby time.

As a method for reducing power consumption of a radio apparatus, for example, a method for improving a configuration of a synchronizing circuit in a digital demodulating unit is known (see for example, Milos Krstic, et. al., "Optimized low-power synchronizer design for the IEEE 802.11a standard," ICASSP 2003 pp. 333-336.).

However, the method described in the Non-Patent Document 1 has a problem such that power consumption of an analog demodulating unit in a receiving unit, cannot be reduced while power consumption of a digital demodulating unit in the radio apparatus can be reduced.

The analog demodulating unit consumes as much power during standby time as when receiving a signal. Therefore, it is desired to reduce power consumption when the analog demodulating unit is in standby state in order to attain lower power consumption of the radio apparatus.

DETAILED DESCRIPTION

Detailed description of the embodiments is made hereunder with reference to the drawings attached.

A radio apparatus according to an embodiment comprises: a first receiver having a first amplifying means that amplifies a radio signal received by an antenna to generate a first amplified signal and a first frequency converting means that frequency-converts the first amplified signal to generate an IF signal; a detecting unit that detects a preamble signal from the IF signal; a second receiver having a second amplifying means that amplifies the radio signal to generate a second amplified signal and a quadrature demodulating means that quadrature-demodulates the second amplified signal to generate an I signal and a Q signal; a demodulating unit that demodulates the I signal and the Q signal to generate a data signal; and a control unit to which a detection signal indicating that the detecting unit detects the preamble signal is supplied, wherein the control unit halts the operation of the first receiver and activates the second receiver when the detection signal is supplied from the detecting unit, and activates the first receiver and halts the operation of the second receiver when the demodulating unit completes the demodulation of the I signal and the Q signal.

According to a radio apparatus of the present embodiment, reduction of power consumption during standby time can be achieved.

Figure 1:
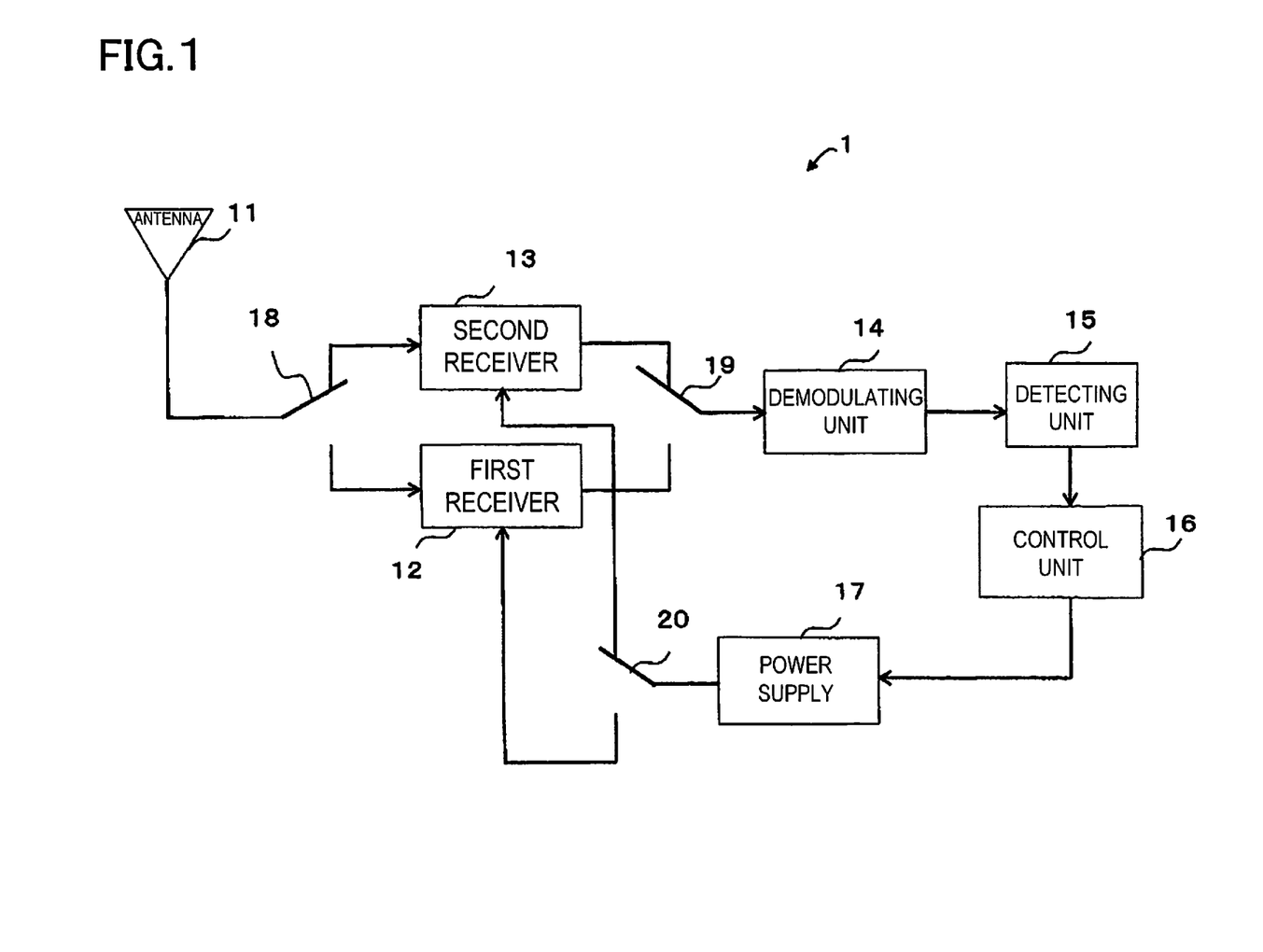
FIG. 1 is a block diagram showing a configuration of a radio apparatus 1 according to an embodiment of the present invention.

FIG. 1 is a block diagram showing a basic configuration of a radio apparatus 1 according to an embodiment.

The radio apparatus 1 includes an antenna 11 that receives a radio signal sent by a communication sender; a first receiver 12 that generates a first IF (Intermediate Frequency) signal from the received radio signal; a second receiver 13 that generates a second IF signal from the radio signal; a demodulating unit 14 that demodulates the second IF signal to generate a data signal; a detecting unit 15 that detects whether the first IF signal includes a preamble or not; a power supply 17 that supplies power-supply voltage to each unit; a first through third switches 18-20; and a control unit 16 that controls each switch. The IF signal shall include Zero-IF.

The first receiver 12 performs analog signal processing such as signal amplifying and downconversion on a radio signal received by the antenna 11 to generate a first. IF signal. The first receiver 12 outputs the generated first IF signal to the demodulating unit 14. The second receiver 13 performs analog signal processing such as signal amplifying and downconversion on a radio signal received by the antenna 11 to generate a second IF signal. The second receiver 13 outputs the generated second IF signal to the demodulating unit 14. The first receiver 12 is configured simpler than the second receiver 13. Accordingly, the power consumption of the first receiver 12 is lower than that of the second receiver 13.

When the first IF signal is input to the demodulating unit 14, it outputs the first IF signal to the detecting unit 15. When the second IF signal is input to the demodulating unit 14, it demodulates the second IF signal to generate a data signal. The demodulating unit 14 outputs the generated data signal to an upper layer that is not shown. Although not illustrated, the demodulating unit 14 shall determine whether the first IF signal is input or the second IF signal is input, according to a notification from the control unit 16.

The detecting unit 15 detects a preamble from the input first IF signal. Specifically, since the preamble consists of a known signal sequence, the detecting unit 15 detects whether the first IF signal includes a signal sequence identical with a preliminary stored signal sequence. If the first IF signal includes the preliminary stored signal sequence, then the detecting unit 15 notifies the control unit 16 of a detection signal indicating that the preamble is detected.

The first switch 18 is provided between the antenna 11 and the first and second receivers 12 and 13. The second switch 19 is provided between the first and second receivers 12 and 13 and the demodulating unit 14. The third switch 20 is provided between the power supply 17 and the first and second receivers 12 and 13. Although not illustrated, the first and second switches 18 and 19 switch a receiver to be connected to the antenna 11 and the demodulating unit 14, respectively, at the direction of the control unit 16. Although not illustrated, the third switch 20 switches a receiver to which the power supply 17 supplies power-supply voltage at the direction of the control unit 16.

The power supply 17 supplies power-supply voltage to the demodulating unit 14, the detecting unit 15 and the control unit 16. The power supply 17 supplies power-supply voltage to the receiver connected via the third switch 20.

The control unit 16 controls the first through third switches 18-20, thereby selecting a receiver operative. The control unit 16 selects the first receiver 12 during standby time to wait for a radio signal. It selects the second receiver 13 during reception time to receive a radio signal.

Firstly, the following will describe the operation of the control unit 16 when the radio apparatus 1 waits for a radio signal.

The control unit 16 controls the first switch 18 so that the first switch 18 selects the first receiver 12. The antenna 11 is connected to the first receiver 12. In addition, the control unit 16 controls the second switch 19 so that the second switch 19 selects the first receiver 12. The demodulating unit 14 is connected to the first receiver 12. The control unit 16 controls the third switch 20 so that the third switch 20 selects the first receiver 12. The power supply 17 supplies power-supply voltage, which is required for the first receiver 12 to operate, to the first receiver 12.

When the antenna 11 receives a radio signal during standby time, the first receiver 12 generates a first IF signal from the radio signal received from the antenna 11. The detecting unit 15 detects a preamble from the first. IF signal to notify the control unit 16 of a detection signal.

When receiving the detection signal, the control unit 16 controls the first through third switches to switch the receiver receiving a signal from the first receiver 12 to the second receiver 13. This enables the antenna 11 and the demodulating unit 14 to be connected to the second receiver 13. In addition, power-supply voltage is supplied to the second receiver 12, while power-supply voltage is not supplied to the first receiver. The control unit 16 notifies the demodulating unit 14 that the receiver is switched.

When the receiver is switched by the control unit 16, a second IF signal is input to the demodulating unit 14. The demodulating unit 14 demodulates the second IF signal to generate a data signal. The demodulating unit 14 may hold the first IF signal so as to demodulate it when demodulating the second IF signal. The demodulating unit 14 is able to generate a data signal with higher accuracy by generating a data signal from a demodulation result of the first and second IF signals. The data signal is input to an upper layer (not shown). In a standby state after the demodulation of all the signals sent by a communication sender is completed, the demodulating unit 14 notifies the control unit 16 of a completion signal indicating that it becomes a standby state.

When receiving the completion signal from the demodulating unit 14, the control unit 16 switches the receiver from the second receiver 13 to the first receiver 12.

Figure 2:
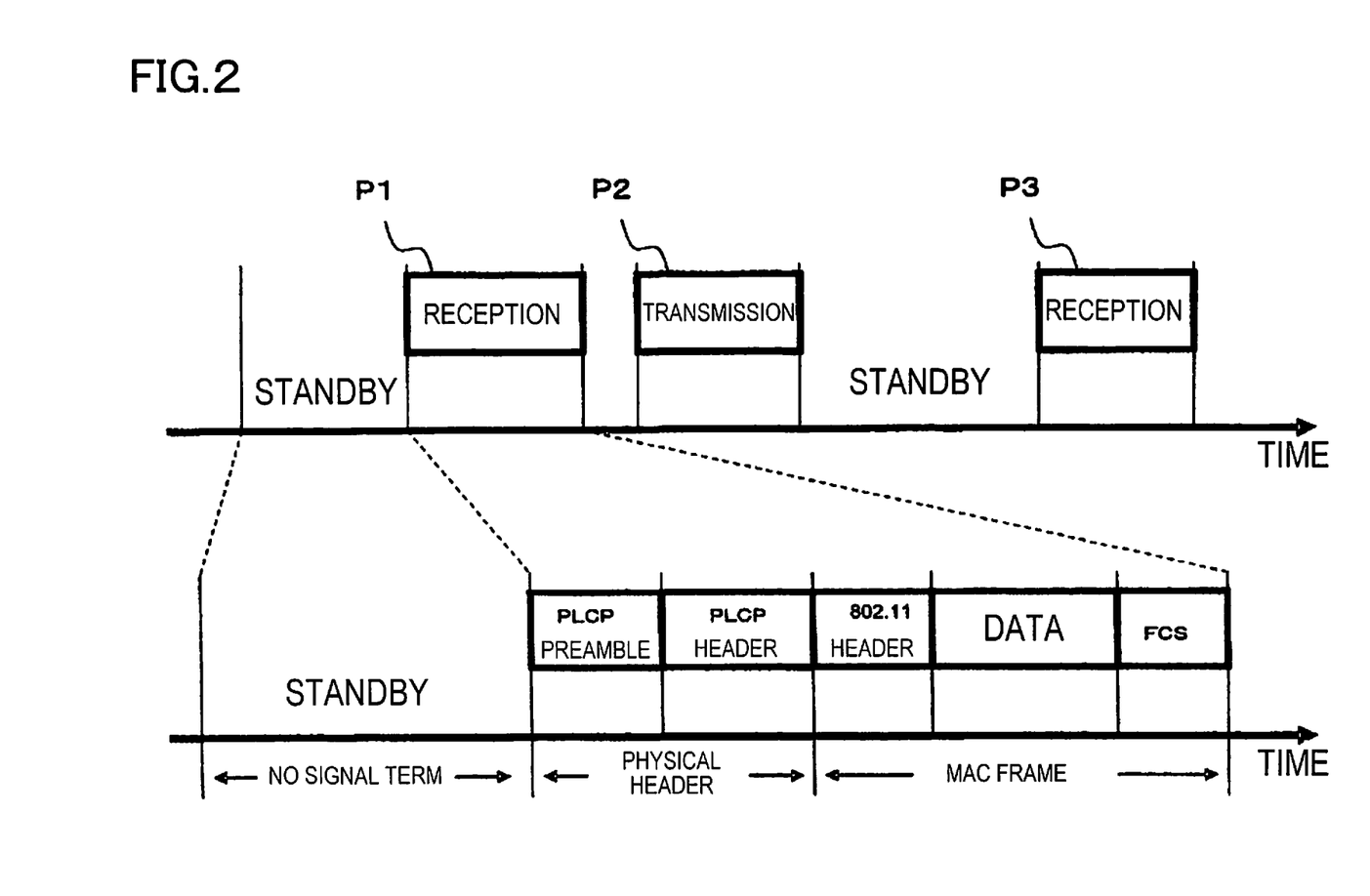
FIG. 2 is a diagram showing a radio communication that the radio apparatus 1 performs.

FIG. 2 shows a radio communication that the radio apparatus 1 performs. The radio apparatus 1 of the present embodiment shall perform radio communications by the packet with a communication sender according to wireless LAN communication standards such as IEEE802.11b/g. In an example of FIG. 2, when receiving a packet P1 from a communication sender, the radio apparatus 1 transmits packet P2 after a certain interval. After a certain period of time, it receives a next packet P3 from the communication sender. In this manner, the radio apparatus 1 transmits/receives packets to/from a communication sender, thereby performing communications. A standby time is a period of time when the radio apparatus 1 does not transmit/receive a packet.

Next, FIG. 2 shows a configuration example of a packet. FIG. 2 shows a configuration of a packet P1 that the radio apparatus 1 receives. Packets P2 and P3 have the same configurations. The description will be made in a case where the configurations of the packet P2 that the radio apparatus 1 transmits and the packets P1 and P3 that it receives are identical. However, the transmission packet and the reception packet may have different configurations.

The packet P1 comprises a physical header and an MAC frame. The physical header comprises a PLCP (physical layer convergence protocol) preamble and a PLCP header. The MAC frame comprises an 802.11 header, a data and an FCS (Frame Check Sequence).

As shown in FIG. 2, the PLCP preamble of the packet P1 arrives from a communication sender. The PLCP preamble is a training signal constituted by a known sequence with 12 sub carriers. The radio apparatus 1 receives the PLCP preamble, thereby performing packet detection, an AGC (Automatic Gain Control) and the like.

The radio apparatus 1 detects a PLCP preamble included in a packet, thereby detecting a radio signal. The packet is converted into the radio signal and transmitted. The radio apparatus 1 detects a signal sequence corresponding to the PLCP preamble from the radio signal, thereby detecting reception of the radio signal.

In other words, in the sections corresponding to the standby time and the PLCP preamble in FIG. 2, the radio apparatus 1 activates the first receiver 12. The first receiver 12 performs analog signal processing on the radio signal corresponding to the PLCP preamble to generate first IF signal. In the sections corresponding to the PLCP header and the MAC frame, the radio apparatus 1 activates the second receiver 13. The second receiver 12 performs analog signal processing on the radio signal corresponding to the PLCP header and the MAC frame to generate a second IF signal.

As described above, the radio apparatus 1 according to the present embodiment activates the first receiver 12, the power consumption of which is low during standby time, thereby allowing the power consumption of the radio-apparatus 1 to be reduced compared to when activating the second receiver 13, the power consumption of which is high during standby time.

Embodiment 1

Figure 3:
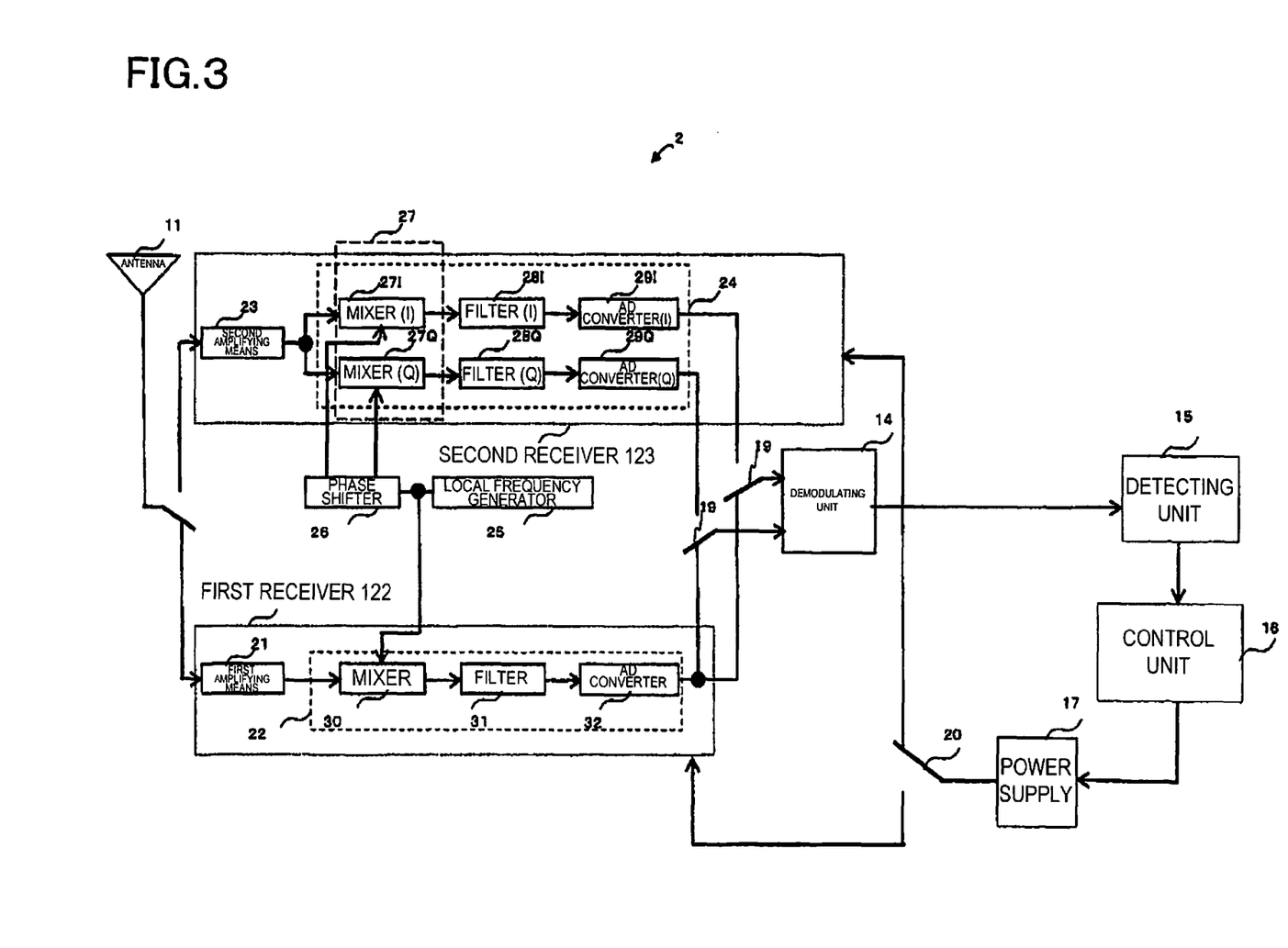
FIG. 3 is a block diagram showing a radio apparatus 2 according to Embodiment 1 of the present invention.

FIG. 3 is a block diagram showing a configuration of a radio apparatus 2 according to Embodiment 1. Identical reference numerals are used to designate the same constituent elements as those of the radio apparatus 1 shown in FIG. 1. Explanations thereof are omitted.

The radio apparatus 2 includes an antenna 11, a first receiver 122, a detecting unit 15, a second receiver 123, a demodulating unit 14 and a control unit 16. The first receiver 122 has at least a first amplifying means 21 that amplifies a radio signal received by an antenna 11 to generate a first amplified signal, and a first frequency converting means 30 that frequency-converts the first amplified signal to generate an IF signal.

A second receiver 123 has at least a second amplifying means 23 that amplifies a radio signal to generate a second amplified signal, and a quadrature demodulating means 27 that quadrature-demodulates the second amplified signal to generate an I signal and a Q signal.

The detecting unit 15 detects a preamble from an IF signal that the first receiver 122 generates. The demodulating unit 14 demodulates the I signal and the Q signal generated by the second receiver 123 to generate a data signal.

The control unit 16 halts the operation of the first receiver and further activates the second receiver when the detecting unit 15 detects a preamble. The control unit 16 activates the first receiver and further halts the operation of the second receiver in a standby state after the demodulation of the I signal and the Q signal is completed.

Furthermore, the radio apparatus 2 includes a local frequency generator 25 that supplies a local oscillation signal to each of the first receiver 12 and the second receiver 13, and a phase shifter 26 that adjusts a phase of the local oscillation signal supplied to the second receiver 13.

With reference to FIG. 3, the radio apparatus 2 will be described in detail.

The first receiver 122 includes the first amplifying means 21, a mixer 30, a filter 31 and an AD converter 32. The mixer 30, the filter 31 and the AD converter 32 are together referred to as a post-receiving unit 22.

The first amplifying means 21 amplifies a radio signal received by the antenna 11 to generate a first amplified signal. The mixer 30 converts a frequency of the first amplified signal using a local oscillation signal output by the local frequency generator 25 to generate an IF signal. The filter 31 suppresses the signal outside a desired band included in the IF signal to generate an analog IF signal. The AD converter 32 converts the analog IF signal to a digital IF signal. The AD converter 32 outputs the digital IF signal to the demodulating unit 14.

The second receiver 123 includes the second amplifying means 23, mixers 27I and 27Q (the mixers 27I and 27Q are together referred to as the quadrature demodulating means 27.), filters 28I and 28Q, and AD converters 29I and 29Q. The mixers 27I and 27Q, the filters 28I and 28Q, and the AD converters 29I and 29Q are together referred to as a post-receiving unit 24.

The second amplifying means 23 amplifies a radio signal received by the antenna 11 to generate a second amplified signal. The phase shifter 26 adjusts a phase of local oscillation signal generated by the local frequency generator 25 to generate an oscillation I signal and an oscillation Q signal, the phases of which are different from each other by 90 degrees. The mixer 27I converts a frequency of the second amplified signal using the oscillation I signal to generate an I signal. The mixer 27Q converts a frequency of the second amplified signal using the oscillation Q signal to generate a Q signal. The I signal and the Q signal are quadrature signals, the phases of which are different from each other by 90 degrees.

The filters 28I and 28Q suppress each signal outside a desired hand included in the I signal and in the Q signal to generate an analog I signal and an analog Q signal, respectively. The AD converters 29I and 29Q convert the analog I signal and the analog Q signal to a digital I signal and to a digital Q signal. The AD converters 29I and 29Q output the digital I signal and the digital Q signal to the demodulating unit 14.

As described above, the radio apparatus 2 according to the first embodiment performs frequency conversion without quadrature-demodulating a quadrature-modulated radio signal before detecting a signal. That is, the first receiver 122 frequency-converts a radio signal corresponding to a PLCP preamble shown in FIG. 2 without quadrature-demodulating it, to generate one system of IF signal.

On the other hand, after detecting a signal, the radio apparatus 2 quadrature-demodulates and frequency-converts the quadrature-modulated radio signal. That is, the second receiver 123 quadrature-demodulates and frequency-converts a radio signal corresponding to the PLCP header and the MAC frame shown in FIG. 2 to generate two systems of signals, which are an I signal and a Q signal.

Since the first receiver 122 has one system of receiving means, the power consumption thereof is lower than that of the second receiver 123 having two systems of receiving means. Accordingly, activation of the first receiver 122 during standby time and activation of the second receiver 123 when receiving a signal can reduce the power consumption of the radio apparatus 2 during standby time.

In addition, in the radio apparatus 2, the first receiver 12 and the second receiver 13 share the local frequency generator 25. Thus, the number of parts of the radio apparatus 2 can be decreased, further allowing the power consumption to be reduced.

Modified Embodiment 1

Figure 4:
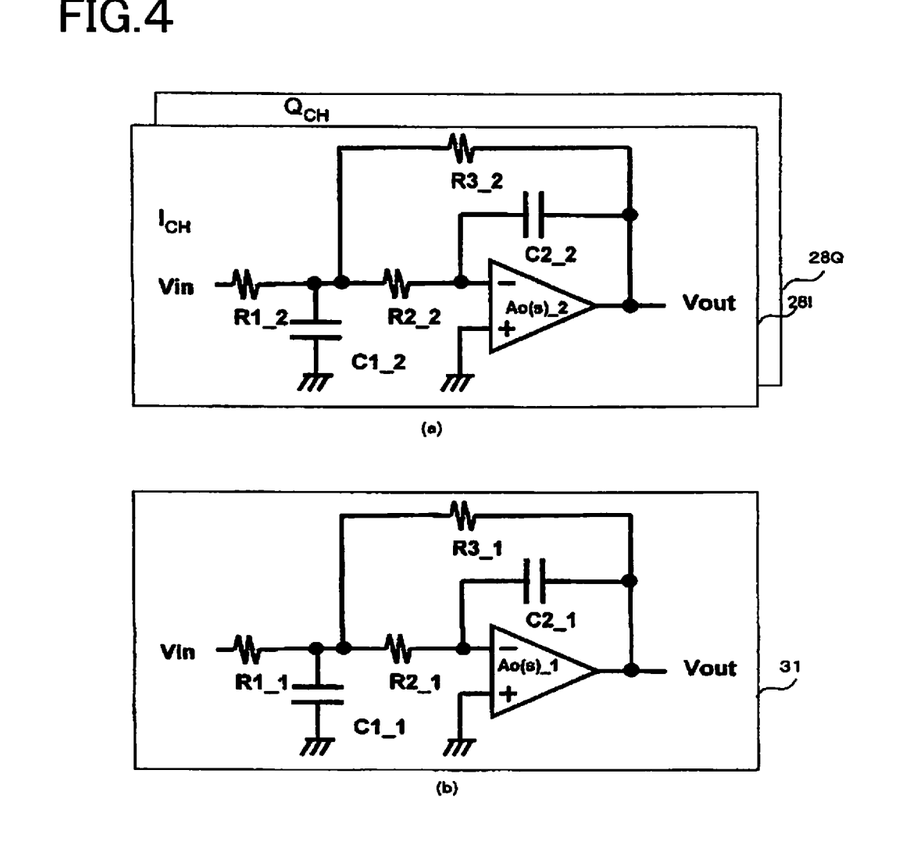
FIG. 4 is a block diagram showing configuration of a filter of the radio apparatus 2.

With reference to FIG. 4, a modified embodiment 1 of the radio apparatus 2 according to Embodiment 1 is shown. FIG. 4 is a diagram showing a circuit configuration of a filter held by the radio apparatus 2. FIG. 4(a) shows a circuit configuration of a filter 28I. Since a circuit configuration of a filter 28Q is identical to that of the filter 28I, the illustration thereof is omitted. FIG. 4(b) shows a circuit configuration of a filter 31.

The filter 28I shown in FIG. 4(a) has an input terminal Vin, an output terminal Vout, an operational amplifier $Ao(s)\_2$, resistances $R1\_2$, $R2\_2$ and $R3\_2$, and capacitors $C1\_2$ and $C2\_2$.

An I signal, which is an output signal of the mixer 27I shown in FIG. 3, is input to the input terminal Vin. The filter 28I suppress the signal (noise) outside a desired band included in the I signal input from the input terminal Vin to generate an analog I signal. The analog I signal is output to the AD converter 29I from the output terminal Vout.

In regard to values of the capacitors $C1\_2$ and $C2\_2$, necessary sizes thereof are determined by the amount of noise to be suppressed. Values of the resistances $R1\_2$, $R2\_2$ and $R3\_2$ are determined by the sizes of the capacitors $C1\_2$ and $C2\_2$. In general, when further suppressing noise, in other words, when low noise is required, the values of the capacitors $C1\_2$ and $C2\_2$ are to be larger and the resistance values $RR1\_2$, $R2\_2$ and $R3\_2$ are to be smaller. This case requires a large driving current and increases the power consumption.

A filter 31 shown in FIG. 4(b) has an input terminal Vin, an output terminal Vout, an operational amplifier $Ao(s)\_1$, resistances $R1\_1$, $R2\_1$ and $R3\_1$, and capacitors $C1\_1$ and $C2\_1$.

The first receiver 122 is required to detect at least a preamble included in a radio signal, therefore the noise does not have to be suppressed as much as the filters 28I and 28Q. Accordingly, the values of the capacitors $C1\_1$ and $C2\_1$ of the filter 31 is set smaller than those of the capacitors $C1\_2$ and $C2\_2$ of the filter 28I. The values of the resistances $R1\_1$, $R2\_1$ and $R3\_1$ of the filter 31 are set larger than those of the resistances $R1\_2$, $R2\_2$ and $R3\_2$ of the filter 28I. That is, if a resistance and a capacitance of the filter 31 of the first receiver 12 are designated as $Rn\_1$ and $Cn\_1$, respectively, and a resistance and a capacitance of the filters 28I and 28Q are designated as $Rn\_2$ and $Cn\_2$, respectively, then the relation is designated as $Rn\_1 = k \times Rn\_2$ and $Cn\_1 = (1/k) \times Cn\_2$.

It is noted that n=1, 2 or 3 and k is a real number equal to or greater than 1. In addition, a current necessary for the operational amplifier Ao(s)_1 of the filter 31 is set smaller than a current necessary for the operational amplifier Ao(s)_2 of the filters 28I and 28Q. That is, the current necessary for the operational amplifier Ao(s)_1 is set (1/k) times as much as the current necessary for the operational amplifier Ao(s)_2.

As described above, in the present modified embodiment, values of the capacitors of the filter 31 are set smaller than those of the filters 28I an 28Q, while values of the resistances of the filter 31 are set larger than those of the filters 28I and 28Q. In addition, a current supplied to the operational amplifier of the filter 31 is set smaller than that of the filters 28I and 28Q. This enables the power consumption of the filter 31 to be lower than that of the filters 28I and 28Q, allowing the power consumption of the radio apparatus 2 can be further reduced during the standby time.

Modified Embodiment 2-1

Next, with reference to FIG. 5, another modified embodiment 2-1 of the radio apparatus 2 will be described. A local frequency generator 25 shown in FIG. 5 has a VCO (Voltage Controlled Oscillator) 36 that generates a local oscillation signal based on a control signal, a frequency divider 37 that frequency-divides the local oscillation signal generated by the VCO to generate a frequency dividing signal, a reference signal generator 33 that generates a reference signal, a phase comparator 34 that compares the reference signal and the frequency dividing signal, a filter 35 that filters a comparison result of the phase comparator 34 to generate the control signal, a signal holder 38 that holds the control signal generated by the filter 35, and a switch 39 that supplies either the control signal generated by the filter 35 or the control signal held by the signal holder 38 to the voltage controlled oscillator 36.

The control unit 16 controls the switch 39 to supply the control signal held by the signal holder 38 to the voltage controlled oscillator 36 while the first receiver 122 is operating, and to supply the control signal generated by the filter 35 to the voltage controlled oscillator 36 while the second receiver 123 is operating.

In addition, the local frequency generator 25 has an ON/OFF switch 40 provided between the VCO 36 and the frequency divider 37. The ON/OFF switch 40 connects or disconnects the VCO 36 and the frequency divider 37 at the direction of the control unit 16. The control unit 16 controls the ON/OFF switch 40 to disconnect the VCO 36 and the frequency divider 37 while the first receiver 122 is operating. The control unit 16 controls the ON/OFF switch 40 to connect the VCO 36 and the frequency divider 37 while the second receiver 123 is operating.

When detecting a radio signal, EVM (Error Vector Magnitude) would not be particularly problematic. It should be determined whether the radio signal is present or not. Accordingly, when detecting a preamble of the radio signal, the accuracy of frequency of the local frequency generator may be any degree of accuracy, with which adjacent channels are not mixed into a desired wave band. A frequency error of several hundred kHz is acceptable in regard to a wireless LAN.

Accordingly, during standby time when a radio signal should be detected, the control unit 16 controls the switch 39 to control the VCO using a control signal held by the signal holder 38. This enables the VCO to output a local oscillation signal even when halting the operation of a phase lock loop (a loop comprising the frequency divider 37, the phase comparator 34, the filter 35 and the VCO 36) of the local frequency generator 25. Thus, the control unit 16 controls the ON/OFF switch 40 during standby time and opens the phase lock loop, thereby allowing the power consumption of the local frequency generator 25 to be reduced.

Opening the phase lock loop may cause a frequency drift. However, closing the loop at regular intervals even in the period of the phase lock loop being open enables the signal holder 38 to hold a control signal that can obtain a desired oscillation frequency. The frequency drift can be avoided as well.

As described above, the local frequency generator 25 closes the phase lock loop while receiving a radio signal, that is, while the second receiver 123 is operating, to control the VCO 36 by a control signal generated by the filter. On the other hand, the local frequency generator 25 opens the phase lock loop during standby time, that is, while the first receiver 122 is operating, to control the VCO 36 by a control signal held by the signal holder 38. The signal holder 38 holds the control signal output by the filter 35 while the phase lock loop is open. In this manner, a local oscillation signal is generated during standby time using a control signal generated while a radio signal is received, thereby allowing the power consumption of the local frequency generator 25 to be reduced. Consequently, reduction of the power consumption of the radio apparatus 2 becomes possible.

In the present modified embodiment, the ON/OFF switch 40 is provided between the VCO 36 and the frequency divider 37. However, the position of the ON/OFF switch 40 is not limited to the example of FIG. 5 if the control of the ON/OFF switch 40 enables the phase lock loop to be open. For example, the ON/OFF switch 40 may be provided between the phase comparator 34 and the filter 35.

Modified Embodiment 2-2

Figure 5:
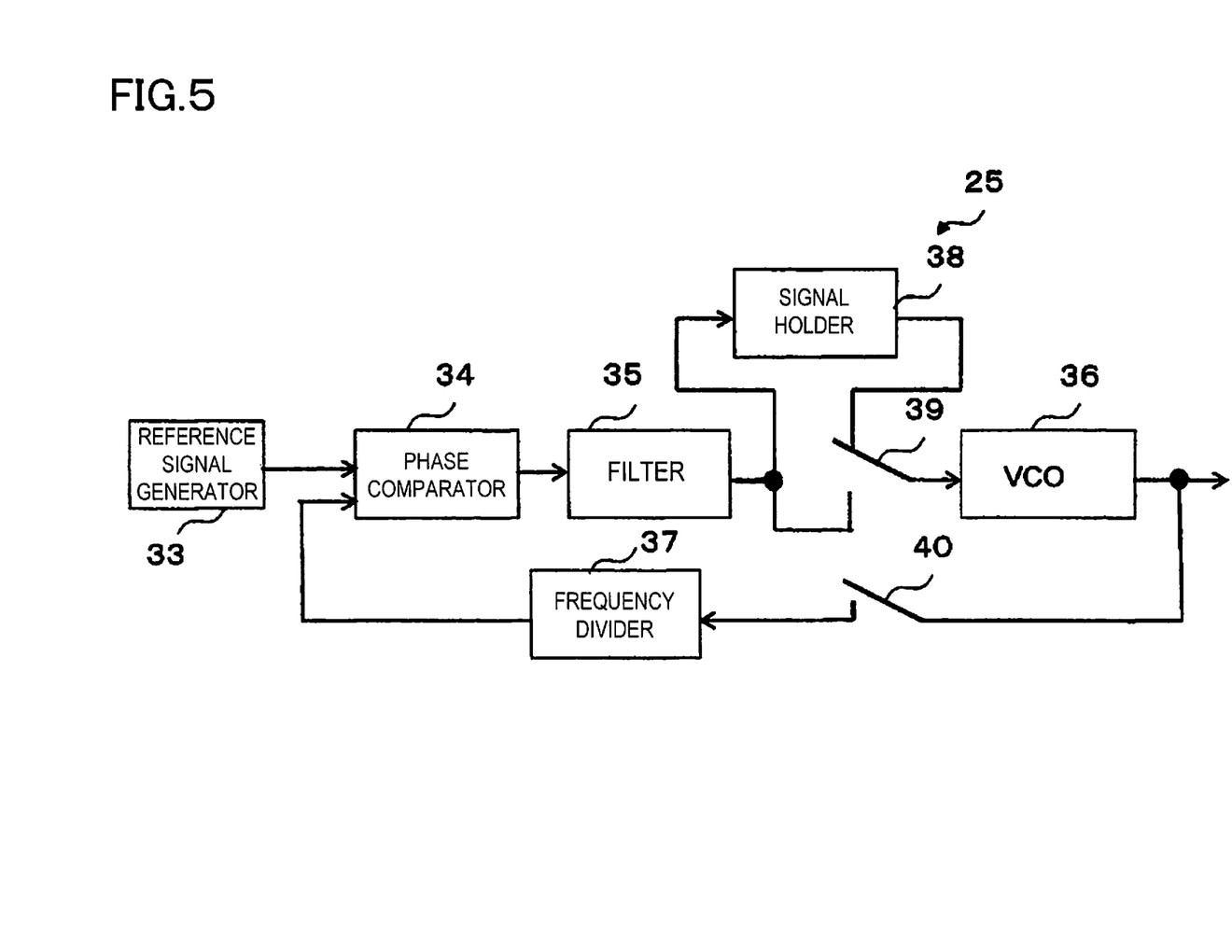
FIG. 5 is a block diagram showing another embodiment of a local frequency generator of the radio apparatus 2.
Figure 6:
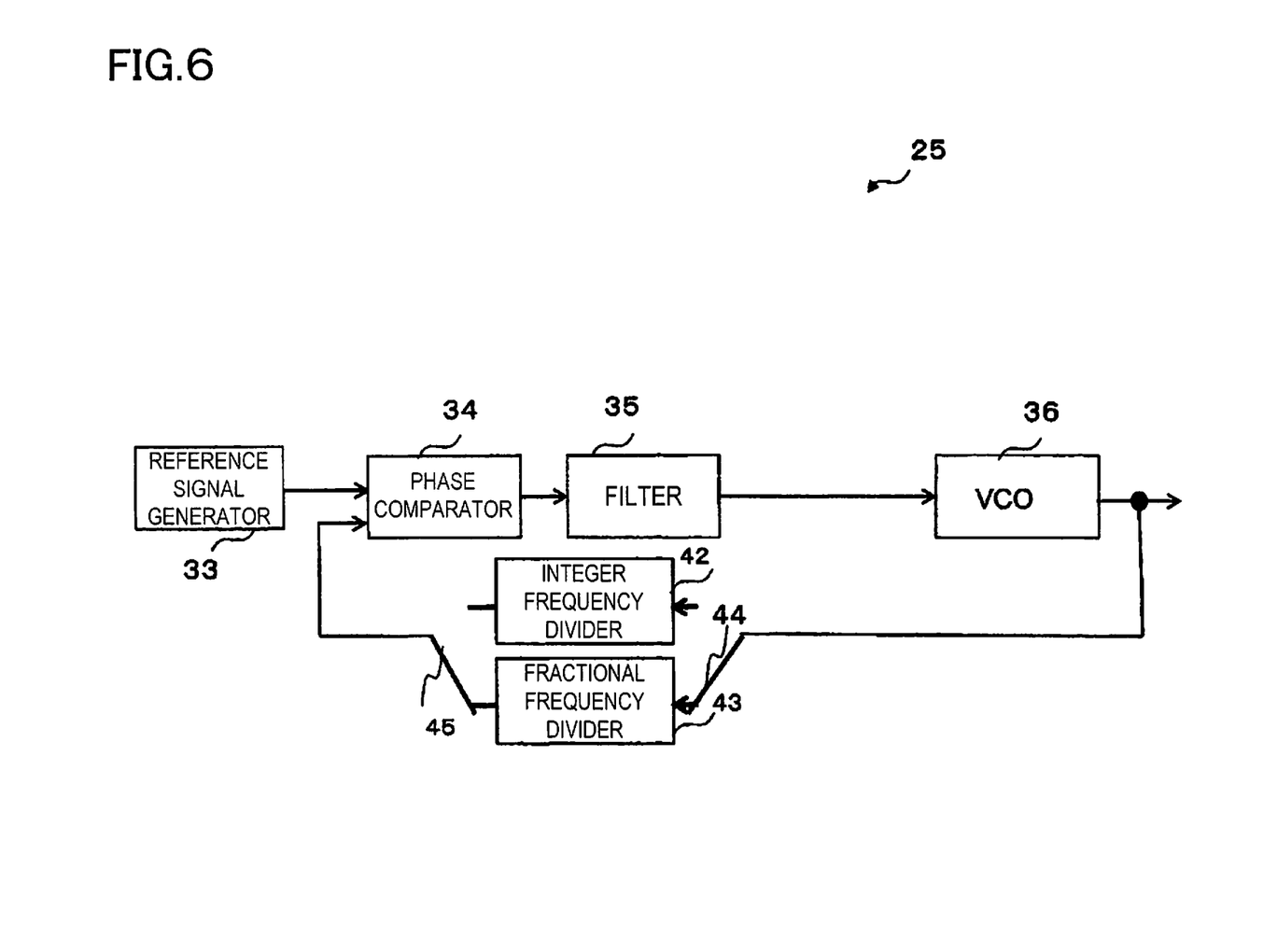
FIG. 6 is a block diagram showing another embodiment of the local frequency generator of the radio apparatus 2.

With reference to FIG. 6, another modified embodiment 2-2 of the local frequency generator 25 will be described. The local frequency generator 25 according to the present modified embodiment includes an integer frequency divider 42, a fractional frequency divider 43, and switches 44 and 45. It differs from the local frequency generator shown in FIG. 5 in that it can select the integer frequency divider 42 or the fractional frequency divider 43 by switching the fifth and sixth switches 44 and 45.

The local frequency generator 25 shown in FIG. 6 is configured in a manner such that the integer frequency divider 42 and the fractional frequency divider 43 are selectable via the fifth switch 44 and the sixth switch 45. The fifth switch 44 and the sixth switch 45 are, for example, controlled by the control unit 16. The fractional frequency divider 43 is made by adding a $\Sigma\Delta$ modulator (now shown) to the integer frequency divider 42, and the power consumption thereof is greater than that of the integer frequency divider 42. The fractional frequency divider 43 is required to increase the frequency accuracy during communications. However, the fractional frequency divider 43 is not always necessary because the frequency accuracy during the wait for a signal may be lower than that during communications. Therefore, during the wait for a signal, that is, during processing by the first receiver 12, the integer frequency divider 42 can be used. Meanwhile, after detecting a preamble signal, the fractional frequency divider 43 is selected during processing by the second receiver 13.

In regard to the radio apparatus of the present embodiment, the integer frequency divider 42 and the fractional frequency divider 43 are selectable in the local frequency generator 25.

Therefore, reduction of the power consumption can be achieved by using the integer frequency divider 42 during standby time and by using the fractional frequency divider when receiving a data.

The radio apparatus shown in FIG. 6 may be configured to have the signal holder 38 shown in FIG. 5. In this case, a control signal is generated using the fractional frequency divider 43 when receiving a radio signal. A control signal is generated using a control signal held by the signal holder 38 during standby time. In order to avoid a frequency drift, the control signal held by the signal holder 38 is updated at regular intervals. At this time, the integer frequency divider 42 may be used to generate the control signal.

Modified Embodiment 3

Figure 7:
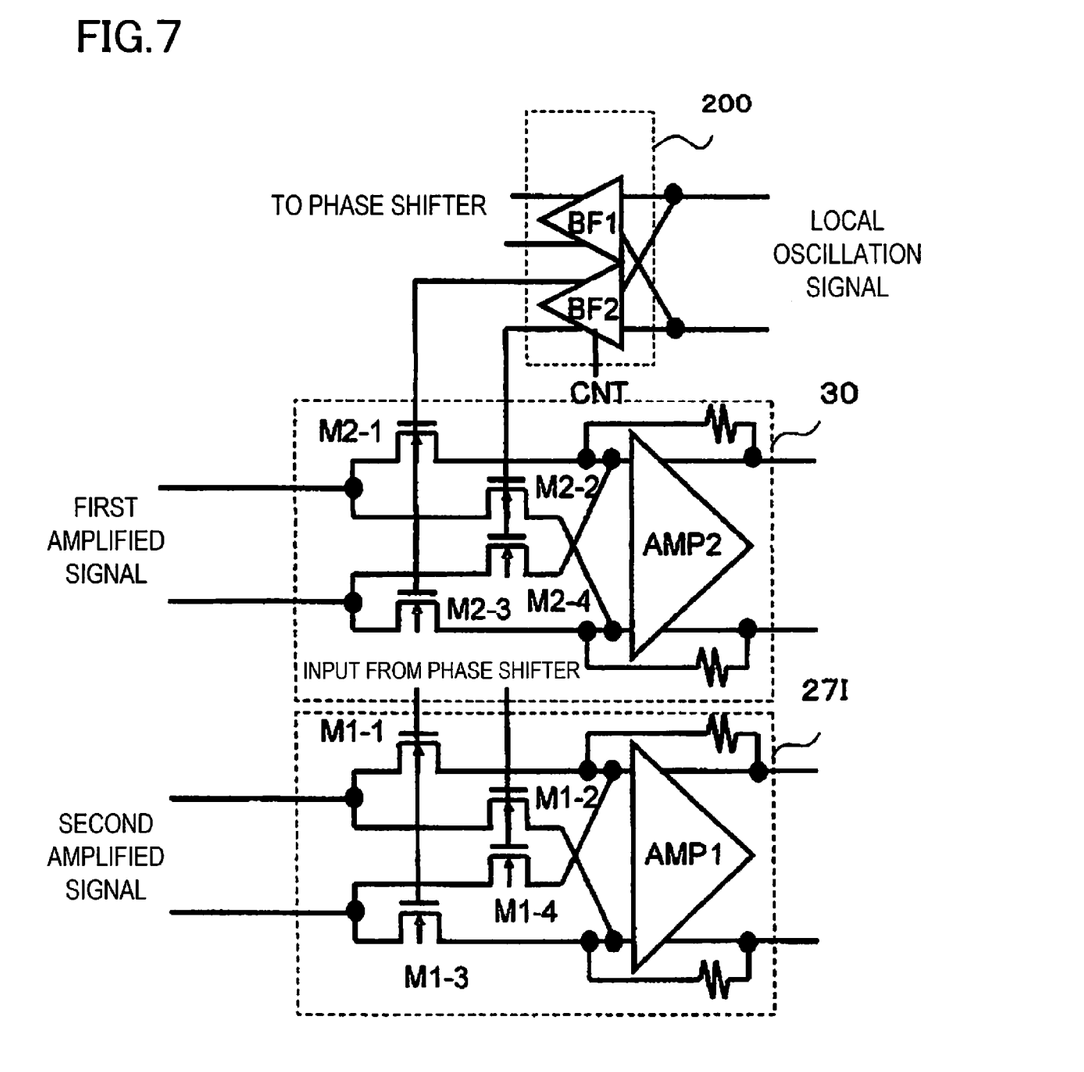
FIG. 7 is a block diagram showing a specific configuration of a mixer of the radio apparatus 2.

FIG. 7 is a diagram showing a modified embodiment 3 of a mixer of the radio apparatus 2. FIG. 7 shows a drive circuit 200 of the mixers 27I and 30 and the mixers 27I, 27Q and 30. The mixer 27Q is not shown and the explanation thereof is omitted because it has the same configuration as the mixer 27I.

The mixer 30 includes transistors M1-1 through M1-4 and an amplifier (AMP1). The mixer 27I and the mixer 27Q have transistors M2-1 through M2-4 and an amplifier (AMP2). A size A of the transistors M1-1 through M1-4 of the mixer 30 is smaller than a size B of the transistors M2-1 through M2-4 of the mixer 27I.

The drive circuit 200 is a mixer drive circuit having an LO buffer circuits BF1 and BF2. A local oscillation signal that the local frequency generator 25 outputs is amplified by the LO buffer circuit BF2 and supplied to the mixer 30. And the local oscillation signal is amplified by the LO buffer circuit BF1 and supplied to the mixer 27I via a phase shifter 25 that is not shown. The mixer 30 frequency-converts a first amplified signal input from a first amplifying means 21, using a local oscillation signal input from the LO buffer circuit BF2, and outputs it to the filter 31. The mixer 27I frequency-converts a second amplified signal input from a second amplifying means 23, using a local oscillation signal input from the phase shifter 25, and outputs it to the filter 28I.

As described above, by making the size A of the transistor M1 of the mixer 30 smaller than the size B of the transistor M2 of the mixers 27I and 27Q, input impedance of the transistors M1-1 through M1-4 gets higher than that of the transistors M2-1 through M2-4. High input impedance can lower the drive ability of the LO buffer circuit that drives transistors. That is, the drive ability of the LO buffer circuit BF2 can be smaller than that of the LO buffer circuit BF1, and a current flowing in the LO buffer circuit BF2 can be less than that in the LO buffer circuit BF1.

Furthermore, since the first receiver 122 may perform analog signal processing at least to detect whether there is a radio signal or not, the accuracy for distortion required for the mixer 30 may be lower than that of the mixer 27I. Accordingly, a current flowing in the amplifier AMP1 can be less than that in the amplifier AMP2. That is, if I1 represents a current consumption of the amplifier AMP1 and I2 represents a current consumption of the amplifier AMP2, then it can be set as I2>I1. This further makes it possible to reduce power consumption of the radio apparatus 2 during standby time.

Embodiment 2

Figure 8:
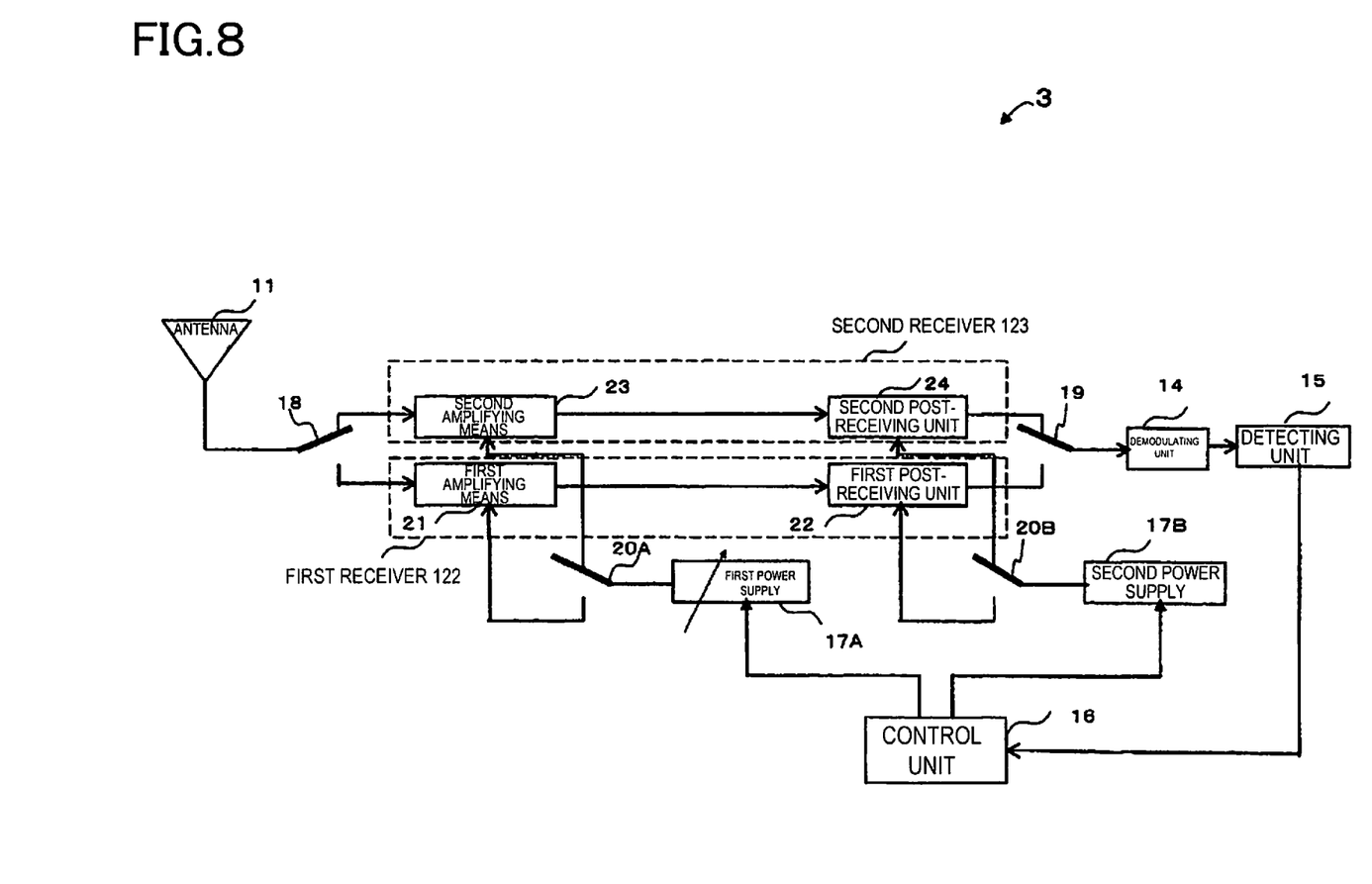
FIG. 8 is a block diagram showing a radio apparatus 3 according to Embodiment 2 of the present invention.

FIG. 8 is a diagram showing a radio apparatus 3 according to Embodiment 2.

The radio apparatuses 1 and 2 shown in FIG. 1 and FIG. 2 are described as they have the power supply 19 that outputs one kind of power-supply voltage. However, the radio apparatus 3 shown in FIG. 8 includes a first power supply 17A that outputs a plurality of power-supply voltages power supply 17B that outputs one kind of power-supply voltage. In the radio apparatus 3 shown in FIG. 8, identical reference numerals are used to designate the same constituent elements as those of the radio apparatus shown in FIG. 3. Explanations thereof are omitted.

The first power supply 17A is a power supply that outputs at least two kinds of voltages, which are a 1-1 voltage and a 1-2 voltage. The 1-1 voltage is lower than the 1-2 voltage. The first power supply 17A supplies the 1-1 voltage to the first amplifying means 21 and supplies the 1-2 voltage to the second amplifying means 23. A third switch 20A switches where to supply power-supply voltage (the 1-1 voltage or the 1-2 voltage). That is, the control unit 16 controls the third switch 20A, thereby the first power supply 17A supplies power-supply voltage to either the first amplifying means 21 or the second amplifying means 23.

Processing performed by the first amplifying means 21 may be easier than processing performed by the second amplifying means 23. Therefore, it is operable with low voltage.

The second power supply 17B supplies a second voltage to a first post-receiving unit 22 or a second post-receiving unit 24. The second power supply 17B supplies a second voltage to a first post-receiving unit or a second post-receiving unit 24. That is, the control unit 16 switches a third switch 20B, thereby the second power supply 17B supplies the second voltage to either the first post-receiving unit 22 or the second post-receiving unit 24.

Figure 9:
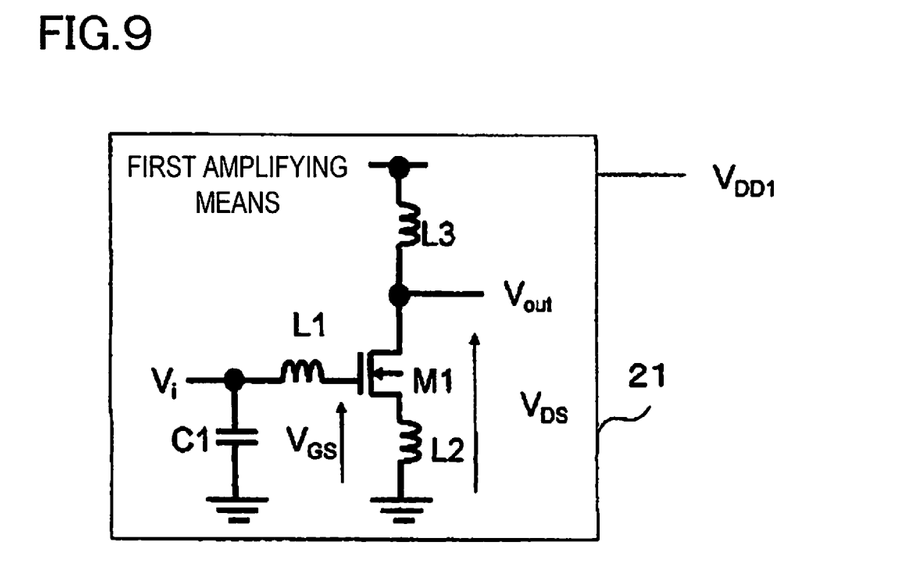
FIG. 9 is a block diagram showing an amplifying means of the radio apparatus 3.

With reference to FIG. 9, an example of the first amplifying means 21 and the second amplifying means will be described. FIG. 9 is a diagram showing an example of the fir amplifying means 21. The explanation of the second amplifying means 23 will be omitted because the first amplifying means 21 and the second amplifying means 23 have the same circuit configurations.

The amplifying means 21 is a source grounding amplifying means having an input terminal Vi, an inductor L1 having one end connected to the input terminal Vi, a capacitor C1 having one end connected to the input terminal Vi and the other end grounded, a transistor M1 having a gate terminal connected to the other end of the inductor L1 and a source terminal, grounded via an inductor L2, an inductor L3 having one end connected to a drain terminal of the transistor M1 and the other end to which a first power VDD1 is supplied, and an output terminal Vout connected to the transistor M1. The first amplifying means 21 amplifies a radio signal input to the input terminal Vi, generates an amplified signal and outputs it from the output terminal Vout.

The inductor L1, the capacitor C1 and the inductor L2 are connected in order to match the first amplifying means 21 and a signal source for driving the first amplifying means 21. L3 is a load inductor.

Since the first amplifying means 21 is a block that has a great influence on the noise of the first receiver 12, the current cannot be decreased easily. However, saturation voltage (maximum signal amplitude) does not significantly affect signal detection even if it is made smaller than a signal amplitude of the second amplifying means. The reason is that the signal detection is possible before an output of the first amplifying means 21 is saturated, and that it is possible to detect whether there is a signal or not even if the amplifying means 21 gets saturated by a great signal being input therein. Therefore, power-supply voltage VDD1 (the 1-1 voltage) may be smaller than power-supply voltage of another circuit.

In this manner, the 1-1 voltage VDD1 supplied to the first amplifying means 21 can be smaller than the 1-2 voltage supplied to the second amplifying means 23 by using a power supply that supplies variable voltage as the first power supply 17A, allowing the power consumption to be decreased.

As described above, by making the 1-1 voltage supplied to the first amplifying means 21 of the first receiver 122 smaller than the power-supply voltage supplied to another circuit, the power that the first power supply consumes can be decreased, and the power consumption of the radio apparatus 3 can be decreased during standby time.

There has been described a case in which the first power supply 17A and the second power supply 17B do not supply power-supply voltage to the first receiver 122 and the second receiver 123 when the operations thereof are halted. However, another configuration may be acceptable, which allows a high-speed switching between a halting status and an operating status of a receiver by flowing smaller current in the receiver to be halted than when the receiver is operating. In this case, the first receiver 122 and the second receiver 123 are circuits using both NMOS and PMOS. This because an operating point (DC point) of the circuit can be set even if the current flow is low in a circuit using both NMOS and PMOS. The low current that flows when the operation of a receiver is halted shall be a current capable of setting a DC point.

In the present embodiment, the description has been made as the configurations of the first and second post-receiving units 22 and 24 are identical to those of the first and second post-receiving units 22 and 24 of the radio apparatus 2 shown in FIG. 3. However, the configurations may be different. For example, when a radio signal is modulated by a modulation method other than quadrature modulation, a post-receiving unit that corresponds to the modulation method of the radio signal may be used.

Embodiment 3

Figure 10:
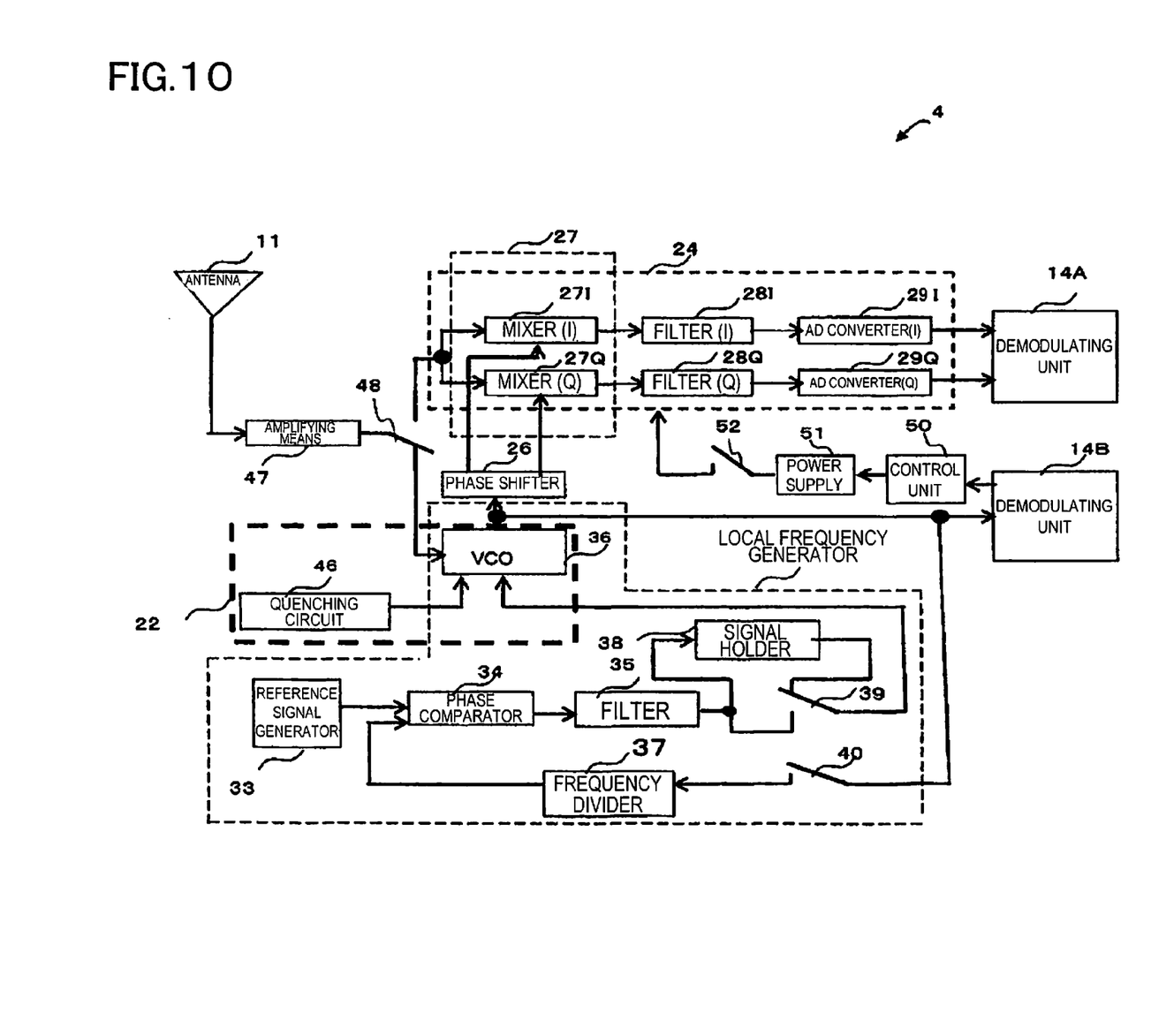
FIG. 10 is a block diagram showing a radio apparatus 4 according to Embodiment 3 of the present invention.

FIG. 10 is a block diagram showing a radio apparatus 4 according to Embodiment 3.
The radio apparatus 3 does not have the first receiver 122 of the radio apparatus 2 shown in FIG. 3, however, it includes a quenching circuit 46 that adds a quench signal to the VCO 36. The other configuration is identical to the radio apparatus 2 shown in FIG. 3 and FIG. 5. Therefore, like reference numerals are used to designate like constituent elements and explanations thereof are omitted.

The second post-receiving unit 24 of the radio apparatus 3 corresponds to the second receiver 13 in FIG. 1. In addition, a superregenerative receiver 22 including the quenching circuit 46 and a VCO 36 corresponds to the first receiver 12 in FIG. 1. In the radio apparatus 3 in FIG. 10, the second post-receiving unit 24 and the superregenerative receiver 22 share an amplifying means 47. However, a configuration may be acceptable in which they individually have an amplifying means.

The VCO 36 generates a first local oscillation signal according to a control signal output by a filter 35 when a radio signal is received. The first local oscillation signal is input to the phase shifter 26. During standby time, the VCO 36 generates a second local oscillation signal according to a second control signal made by superimposing a control signal held by a signal holder on a quench signal generated by the quenching circuit 46. The second local oscillation signal is input to a detecting unit 14B. When the radio apparatus 3 receives a radio signal during standby time, an amplified signal is input to the VCO 36 from the amplifying means 47. The VCO 36 generates a third local oscillation signal according to a third control signal made by superimposing the amplified signal on the second control signal. The third local oscillation signal is input to the detecting unit 14B. The oscillation frequency of the VCO 36 shall be close to the frequency held by the radio signal.

Next, the following will describe the operation of the detecting unit 14B detecting a radio signal by the second local oscillation signal output by the superregenerative receiver 22.

Firstly, during standby time to wait for a radio signal, a control unit 50 controls the quenching circuit 46 to input a quench signal to an input terminal of the VCO 36. The quench signal is generally a saw-tooth wave that increases at a steady slope. It shall be herein a binary signal having a high level and a low level. The VCO 36 operates when a quench signal with high level is input to the VCO 36. That is, the VCO 36 outputs a second oscillation signal. On the other hand, the VCO 36 is halted when a quench signal with low level is input to the VCO 36. That is, the VCO 36 does not output a second local oscillation signal. Thus, The VCO 36 performs an intermittent operation when a quench signal is input thereto.

When the VCO 36 starts operation, the amplitude of the second local oscillation signal increases exponentially over time from the start of the operation. When the antenna 11 receives a radio signal, the third control signal is input to the VCO 36. When the third control signal is input, the time when the amplitude of the second local oscillation signal becomes large comes earlier than when the second control signal is input. That is, compared to the time when the amplitude of the second local oscillation signal becomes large, the time when the amplitude of the third local oscillation signal becomes large comes earlier.

The detecting unit 14B observes the fluctuation of the amplitude of the second local oscillation signal and the third local oscillation signal, and determines that a radio signal is detected when the increase of the amplitude becomes faster exponentially. When determining that the radio signal is detected, the detection unit 14B notifies the control unit 50 of a detection signal indicating the detection.

Next, the following will describe the operation of the control unit 50 switching receivers.

When receiving a detection signal from the detecting unit 14B, the control unit 50 controls a seventh switch 48, an ON/OFF switch 52 and an ON/OFF switch 40.

The seventh switch 48 is provided between the amplifying means 47 and the second post-receiving unit 24 as well as the VCO 36. It switches the connection between the amplifying means 47 and the second post-receiving unit 24 and the connection of the amplifying means 47 and the VCO 36. When receiving a detection signal from the detecting unit 14B, the control unit 50 controls the seventh switch 48 to connect the amplifying means 47 and the second post-receiving unit 24.

The ON/OFF switch 52 is provided between a power supply 51 and the second post-receiving unit 24, and switches connection/disconnection between the power supply 51 and the second post-receiving unit 24. The power supply 51 supplies power-supply voltage to the second post-receiving unit 24 via the ON/OFF switch 52. Power-supply voltage is supplied from the power supply 51 when the ON/OFF switch 52 is closed. Accordingly, the second post-receiving unit 24 operates. That is, the second post-receiving unit 24 performs signal processing on an amplified signal to generate a digital I signal and a digital Q signal. On the other hand, power-supply voltage is not supplied from the power supply 51 when the ON/OFF switch 52 is open. Accordingly, the second post-receiving unit 24 is halted. When receiving a detection signal from the detecting unit 14B, the control unit 50 controls the ON/OFF switch 52 so that the power supply 51 supplies power-supply voltage to the second post-receiving unit 24.

In addition, the control unit 50 controls the quenching circuit 46 and a local frequency generator 49 so that a control signal is input to an input terminal of the VCO 36.

In this manner, the control unit 50 controls each unit, thereby a radio signal is demodulated by the second post-receiving unit 24 and a demodulating unit 14A.

In a standby state after the demodulation of a radio signal is completed, the demodulating unit 14A notifies the control unit 50 of a completion signal indicating that reception is completed and it becomes a standby state.

When receiving a completion signal from the demodulating unit 14A, the control unit 50 controls the seventh switch 48, the ON/OFF switch 52 and the ON/OFF switch 40. The control unit 50 controls the seventh switch 48 to connect the amplifying means 47 and the VCO 36. The control unit 50 controls the ON/OFF switch 52 to halt the second post-receiving unit 24. In addition, the control unit 50 controls the quenching circuit 46 and the local frequency generator 49 so that a quench signal is input to an input terminal of the VCO 36.

As described above, according to the radio apparatus 3 of Embodiment 3, the power consumption of the radio apparatus 3 can be reduced during standby time by waiting for a radio signal using the superregenerative receiver 22, the power consumption of which is smaller than that of the second post-receiving unit 24 during standby time.

Furthermore, sharing the VCO 36 by the superregenerative receiver 22 and the local frequency generator 49 allows reduction of the number of parts.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

For example, a wireless LAN is described as an example in the embodiments. However, such embodiments can be applied to any radio apparatus, the conditions of which changes according to the contents and time of a signal to be received.

What is claimed is:

1. A radio apparatus comprising:
a first receiver comprising:
a first amplifier that generates a first amplified signal by amplifying a first radio signal received by an antenna;
a first mixer that generates an IF signal by converting a frequency of the first amplified signal; and
a first filter that suppresses a portion of the IF signal which is outside of a desired band;
a detector that detects a preamble from the IF signal which is outputted from the first receiver;
a second receiver comprising:
a second amplifier that generates a second amplified signal by amplifying a second radio signal received by the antenna, wherein a frequency of the second radio signal is the same as a frequency of the first radio signal;
a second mixer that generates an I signal by converting a frequency of the second amplified signal;
a second filter that suppresses a portion of the I signal which is outside of a desired band;
a third mixer that generates a Q signal by converting the frequency of the second amplified signal; and
a third filter that suppresses a portion of the Q signal which is outside of a desired band;
a demodulator that demodulates the I signal and the Q signal each of which is outputted from the second receiver; and
a controller that halts the operation of the first receiver and activates the second receiver when the detector detects the preamble, and activates the first receiver and halts the operation of the second receiver during standby time;
wherein the first filter has a first capacitor and a first resistance, to filter the IF signal; and
wherein each of the second filter and the third filter includes (i) a second capacitor having a value larger than the first capacitor, and (ii) a second resistance having a resistance value smaller than the first resistance, to filter the I signal and the Q signal, respectively.

2. The radio apparatus as set forth in claim 1, further comprising a local frequency generator that generates a local oscillation signal and supplies the local oscillation signal to (i) the first mixer which is included in the first receiver and which generates the IF signal, (ii) the second mixer which is included in the second receiver and which generates the I signal, and (iii) the third mixer which is included in the second receiver and which generates the Q signal.

3. The radio apparatus as set forth in claim 2, wherein the local frequency generator comprises:
a voltage controlled oscillator that generates the local oscillation signal based on a control signal;
a frequency divider that frequency-divides the local oscillation signal to generate a divided signal;
a phase comparator that compares the divided signal and a reference signal;
a filter that filters a comparison result of the phase comparator to generate the control signal;
a signal holder that holds the control signal generated by the filter; and
a switch that supplies either the control signal generated by the filter or the control signal held by the signal holder to the voltage controlled oscillator, and
wherein the controller controls the switch to supply the control signal held by the signal holder to the voltage controlled oscillator while the first receiver is operating, and to supply the control signal generated by the filter to the voltage controlled oscillator while the second receiver is operating.

4. The radio apparatus as set forth in claim 3, wherein a power-supply voltage of the first amplifier is lower than a power-supply voltage of the second amplifier.

5. The radio apparatus as set forth in claim 2, wherein the local frequency generator comprises:
a voltage controlled oscillator that generates the local oscillation signal based on a control signal;
an integer frequency divider that integrally frequency-divides the local oscillator;
a fractional frequency divider that fractionally frequency-divides the local oscillator;
a phase comparator that compares a reference signal and an output of the integer frequency divider or an output of the fractional frequency divider;
a filter that filters a comparison result of the phase comparator to generate the control signal; and a switch that supplies the output of either the integer frequency divider or the fractional frequency divider to the phase comparator, and wherein the controller controls the switch to supply the output of the integer frequency divider during the standby time, and to supply the output of the fractional frequency divider when the detector detects the preamble.

6. The radio apparatus as set forth in claim 1, wherein:

the first mixer, which is included in the first receiver and which generates the IF signal, includes a first transistor; and each of (i) the second mixer, which is included in the second receiver and which generates the I signal, and (ii) the third mixer, which is included in the second receiver and which generates the Q signal, includes a second transistor having a size larger than a size of the first transistor.

\* \* \* \* \*